United States Patent [19]

Higgins, III

[11] Patent Number: 4,727,410

[45] Date of Patent: Feb. 23, 1988

[54] HIGH DENSITY INTEGRATED CIRCUIT PACKAGE

[75] Inventor: Leo M. Higgins, III, South Easton, Mass.

[73] Assignee: Cabot Technical Ceramics, Inc., Boston, Mass.

[21] Appl. No.: 555,032

[22] Filed: Nov. 23, 1983

[51] Int. Cl.$^4$ ............................................. H01L 23/02
[52] U.S. Cl. ...................................... 357/74; 357/75; 357/80; 361/380; 361/412; 361/414; 174/52 FP
[58] Field of Search ....................... 357/74, 75, 80, 81; 361/380, 395, 401, 412, 413, 414; 174/52 FP

[56] References Cited

U.S. PATENT DOCUMENTS

| | | | |
|---|---|---|---|
| 3,346,773 | 10/1967 | Lomerson | 317/100 |
| 3,545,079 | 12/1970 | Kossar | 29/626 |
| 3,546,776 | 12/1970 | Rodriguez et al. | 29/626 |
| 3,968,193 | 7/1976 | Langston, Jr. et al. | 357/75 X |
| 4,245,273 | 1/1981 | Feinberg et al. | 361/382 |
| 4,322,778 | 3/1982 | Barbour et al. | 361/414 |
| 4,328,530 | 5/1982 | Bajorek et al. | 361/401 |
| 4,345,955 | 8/1982 | Bakermans et al. | 156/89 |
| 4,349,862 | 9/1982 | Bajorek et al. | 361/401 |
| 4,549,200 | 10/1985 | Ecker et al. | 357/80 |
| 4,608,592 | 8/1986 | Miyamoto | 357/80 |

FOREIGN PATENT DOCUMENTS 81-2367 8/1981 PCT Int'l Appl. ......... 174/52 FP X

OTHER PUBLICATIONS

Benenati et al., IBM Tech. Disc. Bull., 10(12), May 1968, "Circuit Package", pp. 1977–1978.
Arnold et al., IBM Tech. Disc. Bull., 9(6), Nov. 1966, "Fabrication of Multilayer Ceramic Structure . . .", pp. 565–566.

Primary Examiner—William L. Sikes
Assistant Examiner—Frank González
Attorney, Agent, or Firm—Weingarten, Schurgin, Gagnebin & Hayes

[57] ABSTRACT

A multifaceted package is disclosed that permits VLSI and VHSIC integrated circuits in the form of integrated circuit die or chip carries to be mounted on the faces of the package to form a high-density circuit package. The package comprises a plurality of ceramic layers which are cofired and fused together to form a monolithic body having a plurality of planar faces. The body may have a cubic, pyramidal, pentagonal, or other solid geometric form and may have integrated circuit elements disposed on one or more faces of the body. Integrated circuit die or dies discrete electrical components such as chip carriers, resistors, etc. may be mounted to faces of the body and a lid may be provided for hermetic encapsulation of integrated circuit die between lids and respective faces of the body. In another embodiment, integrated circuit die or dies are disposed in a carrier comprising a plurality of ceramic layers which are cofired and fused to form a monolithic body and having conductive paths and vias on and through selected ones of the layers for electrical interconnection of the die or dies with contact sites provided on respective faces of the body. Selected faces of the body may be provided with contact sites oriented to mate with contacts of standard leaded or leadless chip carriers. The body may additionally be provided with means to facilitate removal of heat generated during operation by integrated circuit devices disposed on respective body faces or devices disposed in carriers attached to respective body faces.

30 Claims, 17 Drawing Figures

HIGH DENSITY INTEGRATED CIRCUIT PACKAGE

FIELD OF THE INVENTION

This invention relates to packaging techniques for integrated circuit devices and more specifically to an integrated circuit package of monolithic ceramic construction adapted to receive integrated circuit devices on faces of the package.

BACKGROUND OF THE INVENTION

It is desirable to provide integrated circuit packages which facilitate the mounting of integrated circuit devices in high-density for a number of reasons. The speed of operation of VHSIC and VLSI devices is often significantly affected by the length of interconnecting leads between respective integrated circuit devices. For this reason it is advantageous to package plural devices in high-density to provide the shortest interconnection lead configuration feasible. It is also important to minimize interconnection lead lengths between connections of integrated circuit devices to minimize noise and cross-talk within a circuit. High-density packaging techniques also minimize noise and cross-talk.

Improved packaging densities also permit reduced system packages sizes and additionally reduced power supply requirements as a consequence of reduced lead and stray capacitances associated with interconnections between respective integrated circuit devices.

Typically, a single integrated circuit die is mounted within a dual-in-line circuit package, a leadless chip carrier or a leaded chip carrier and such packages are in turn interconnected to form a desired electrical circuit. The sizes of the respective packages are significantly larger than the sizes of the dies disposed within the packages thereby limiting the overall packaging density.

Various packaging techniques have been developed to improve integrated circuit packaging density. One package is disclosed in application Ser. No. 498,089 of the same assignee as the present invention. A high-density motherboard is therein described which has two major surfaces. Conductive pads are disposed on the major surfaces of the motherboard and oriented to electrically mate with input-output connections of specified integrated circuit devices. Input-output pins project from a pin edge of the motherboard and are typically provided in a dual-in-line arrangement to permit mounting of the package using typical dual-in-line mounting techniques.

Other packaging systems and structures are disclosed in U.S. Pat. Nos. 4,345,955; 4,338,621; 4,336,088; 4,332,778; 4,245,273; and 3,812,402.

SUMMARY OF THE INVENTION

In accordance with the present invention a ceramic package is disclosed which provides for mounting of one or more integrated circuit devices to each face of the package.

The package is composed of a body which comprises a plurality of confronting ceramic layers which are cofired and fused together to form a solid monolithic geometric form having planar faces. Typically, the body is cubic in form, however, the body may be of any solid geometric form having planar faces of area sufficient for mounting an integrated circuit device thereto.

The side faces and top and bottom surfaces of the body may be adapted to receive one or more integrated circuit devices and/or other electrical components. The body has a bottom surface which is typically reserved for input-output connections, however, in specific embodiments, the bottom surface, as indicated, may also receive an integrated circuit device or devices. Input-output connections may be in the form of input-output pins, a pin grid array, a pad grid array or any other suitable means for input-output connection.

The body faces may be adapted to receive either chip carriers or integrated circuit die on the faces of the body.

If a body face is intended to receive a chip carrier, contact sites are disposed on the body face and oriented to mate with corresponding contacts of a predetermined chip carrier. Leaded, leadless or chip carriers in accordance with the present invention may be accomodated by appropriate orientation of contact sites on respective body faces.

If it is intended that a body face receive an integrated circuit die, each die receiving face may be provided with a mating lid. The die or dies may be hermetically sealed between the respective lid and the face. When die or dies are mounted to a body face, connection sites are provided on the respective face and electrical interconnections are made between selected contacts on the die and selected connection sites by wire bonding, tape automated bonding, solder bump chip attach, or any other suitable interconnection technique known in the art. Contact sites may be provided in a predetermined pattern on the face of the body to mate with corresponding contact sites on the lid, thereby providing test point access to selected electrical nodes after mating of the lid with the body.

A chip carrier, alternatively may be provided which is intended to receive one or more integrated circuit die. The face-confronting-surface of the carrier is provided with connection sites in a substantially annular pattern around the intended mounting location of the die and selected die contacts are wire bonded, connected by tape automated bonding, solder bump die attached, or otherwise interconnected via methods known in the art to selected ones of the connection sites. The connection sites are electrically interconnected to carrier contact sites disposed peripherally with respect to the connection sites. Carrier contact sites are oriented on the face confronting surface of the carrier so as to mate with corresponding contact sites on the face of the body. The carrier contact sites may be in the form of conductive vias extending through the carrier, thereby providing test points for access to die contacts both before and after mating of the carrier to a respective face.

Selected contact sites on the respective body faces are electrically interconnected to selected other contact sites and contact sites are selectively interconnected to ones of the input-output pins to form a package of a desired circuit configuration. Conductive paths are disposed on selected ones of the layers and contact sites on the body faces correspond to termination points of selected ones of the conductive paths at the respective faces. Interconnection of selected paths on separate layers is achieved by conductive vias extending through selected ones of the layers in selected locations.

The body may be optionally provided with a heat sink or may be adapted for fluid cooling of the body to facilitate removal of heat during operation of the package in a circuit.

BRIEF DESCRIPTION OF THE DRAWINGS

The invention will be more fully understood from the following description taken in conjunction with the accompanying drawings, in which.

DETAILED DESCRIPTION OF THE INVENTION

The novel package presently disclosed permits mounting of integrated circuit elements to all faces of the package and permits true three dimensional interconnection within the package. Package construction will be understood by reference to FIGS. 1-11.

Figure 2A:
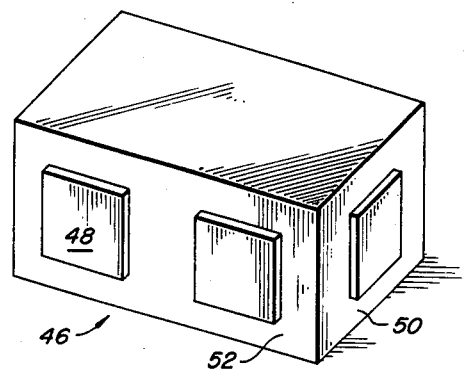
FIGS. 2A, 2B, and 2C are illustrative of body shapes having substantially rectangular, hexagonal, and octagonal cross-sections respectively.
Figure 2B:
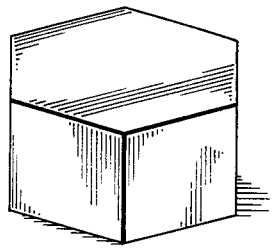
Figure 2C:
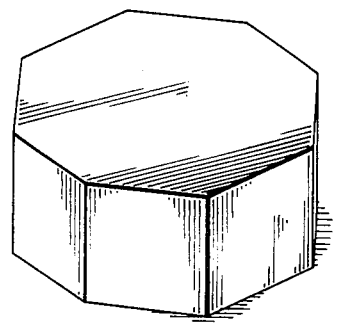

The package comprises a unitary body 10 formed by cofiring and fusing a plurality of ceramic layers 12 together to form a body having a number of planar faces 14. While typically the body 10 is of cubic shape, the body 10 may be of any other solid geometric form having planar faces. Bodies of rectangular, hexagonal and octagonal cross-section are illustrated in FIGS. 2A, 2B and 2C respectively. Each one of the respective faces 14 may receive an integrated circuit device or devices in the form of an integrated circuit die or dies or an integrated circuit disposed within a standard leadless or leaded chip carrier (FIGS. 6 and 7) or a chip carrier in accordance with the present invention. Additionally, the body faces and/or chip carriers in accordance with the present invention may be adapted to receive discrete electrical components such as chip capacitors, chip resistors and/or thick film resistors and capacitors.

Figure 3A:
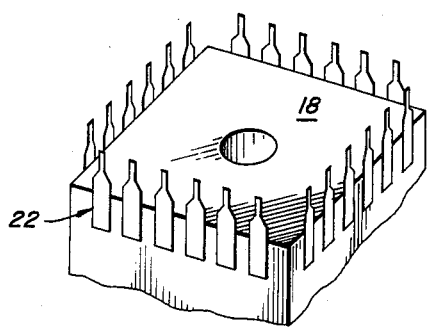
FIGS. 3A, 3B, 3C, and 3D illustrate input-output connection techniques for use with the present invention.
Figure 3B:
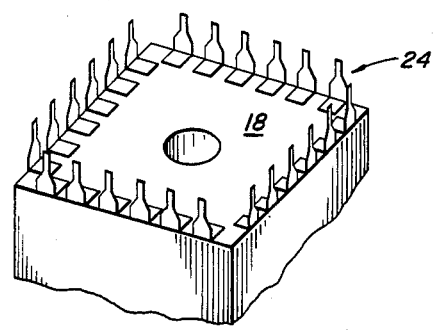
Figure 3C:
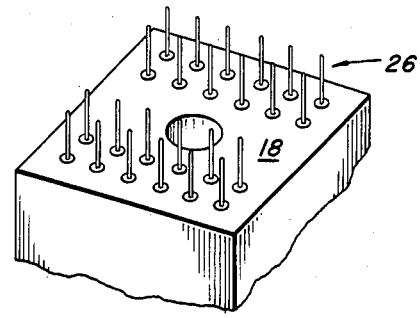
Figure 3D:
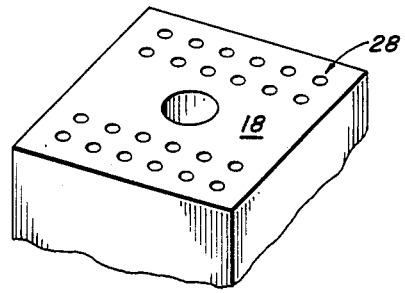

The body has a bottom layer 16 of ceramic material, having a bottom surface 18 which is typically reserved for input-output connections 20. Input-output connections may comprise projecting side brazed input-output pins 22 as shown in FIG. 3A, bottom brazed input-output pins 24 as illustrated in FIG. 3B, a pin 26 grid array as shown in FIG. 3C, or a pad 28 grid array as illustrated in FIG. 3D.

The body has a height 30 determined by the number and thickness of the respective layers 12. The layers 12 may vary greatly in thickness and are typically of thickness between 0.8 mils and 100 mils.

Figure 5:
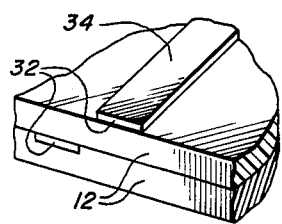
FIG. 5 is a greatly enlarged perspective view illustrating contact site formation at points where conductive paths terminate in faces of the body.
Figure 4:
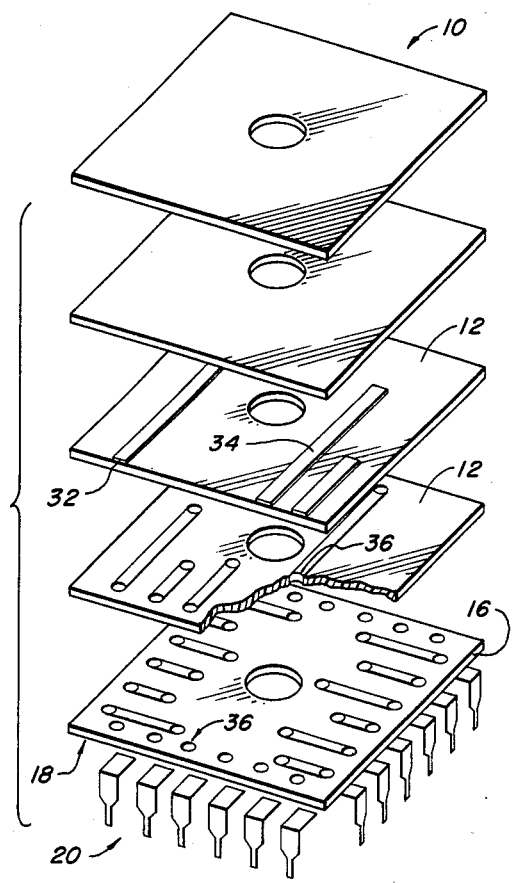
FIG. 4 is an exploded perspective view of a package in accordance with the present invention.

Contact sites 32 are provided on the faces 14 of the body in locations where conductive paths 34 disposed on the respective layers 12 terminate in the body faces as seen in FIG. 4 and 5. A circuit having a predefined electrical interconnection configuration is provided by interconnecting selected ones of the contact sites 32 with other selected contact sites 32 and interconnecting selected contact sites 32 with selected input-output connections 20. Interconnections are accomplished with conductive paths 34 provided on selected ones of the layers 12 and conductive vias 36 for interconnection of paths 34 on different layers 12.

The conductive paths 34 may be formed by silk screening predetermined patterns of conductive material on selected layers prior to lamination. The conductive paths typically have a cross-section, after firing, of 8 mils by 0.6 mils although conductive path dimensions of 2 mils by 0.5 mils to 8 mils by 8 mils may be readily achieved.

Conductive vias 36 may also be employed to provide contact sites (not shown) on the top or bottom surfaces of the body to permit mating of integrated circuit devices on those surfaces or to provide for connection to input-output connections 20 disposed on the bottom surface, such as bottom brazed input-output pins, a pin grid or a pad grid. Moreover, if the body is fabricated with layers vertically oriented, contact sites on selected body faces are formed by vias 36 and contact sites on the top and bottom surfaces and other selected faces are provided at the locations where conductive paths terminate on the body faces.

Figure 6:
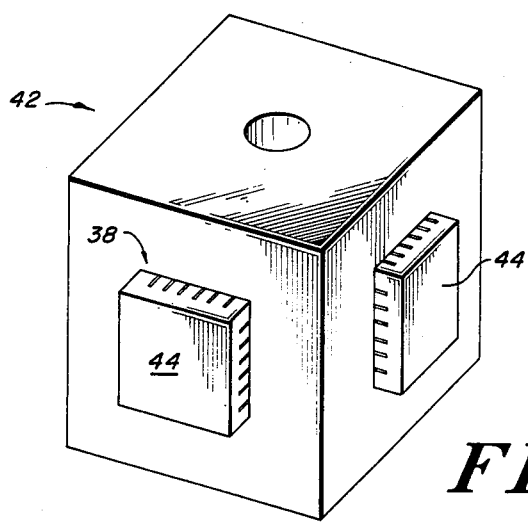
FIG. 6 illustrates a body in accordance with the present invention which is adapted to receive leadless chip carriers.

In one embodiment of the invention illustrated in FIG. 6 contact sites 38 are provided on respective faces 40 of the body 42 to mate with corresponding contacts of leadless chip carriers 44. As illustrated in FIG. 2A the body 46 may be appropriately sized to accomodate one or more leadless chip carriers as shown on respective faces 50 and 52 of the body 46.

Figure 7:
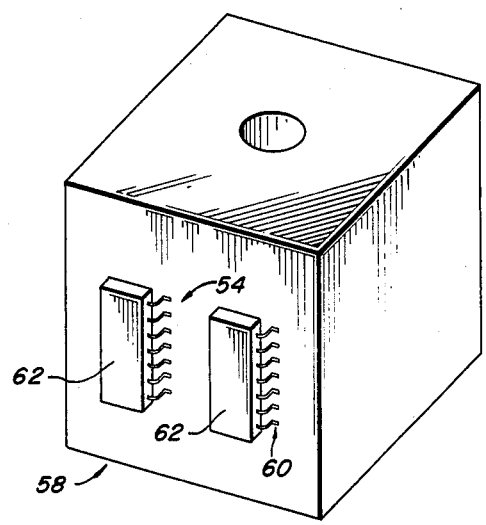
FIG. 7 is illustrative of a body in accordance with the present invention which is adapted to receive leaded chip carriers on respective faces of the body.

In another embodiment of the invention shown in FIG. 7 contact sites 54 are provided at selected locations on respective faces 56 of the body 58 to mate with corresponding leads 60 of leaded chip carriers 62. The body may be of size to accomodate one or more leaded chip carriers 62 on each face 56 of the body 58. Additionally, contact sites on selected faces may be oriented to accommodate integrated circuit packages having a pin grid or pad grid array.

Conductive paths 34 are disposed on the layers 12 such that ones of the paths 34 terminate in predetermined lateral positions in the faces 14 thereby determining the lateral position of contact sites 32. The height of each contact site 32 on each of the layers 12 with respect to the bottom surface 18 is determined by preselection of the thickness of each of the respective layers 12 of the body 10. As previously indicated the contact sites correspond to points where conductive paths terminate in the body faces and are therefore typically of cross-section of 8 mils by 0.6 mils.

Contact sites 32 corresponding to locations of conductive paths 34 termination may be provided with an increased contact area at the body face in a number of ways.

Layers 12 may include channels along intended locations of selected conductive paths 34 or may include recesses at locations of intended contact sites thereby enlarging the area of contact site 32 cross-sections at points of termination of the channels or recesses at the body face 14.

Respective faces 14 may also be silk screened with conductive material to provide enlarged contact areas for respective contact sites 32.

Alternatively, a ceramic thick film insulator may be silk screened over respective cube faces 14 so as to provide wells corresponding to intended contact site locations. The faces may then be silk screened in a second operation to fill respective wells with conductive material to form respective contact sites 32.

A ceramic thick film conductive material may alternatively be applied in a post firing operation to locate contact sites with extreme accuracy.

Figure 8A:
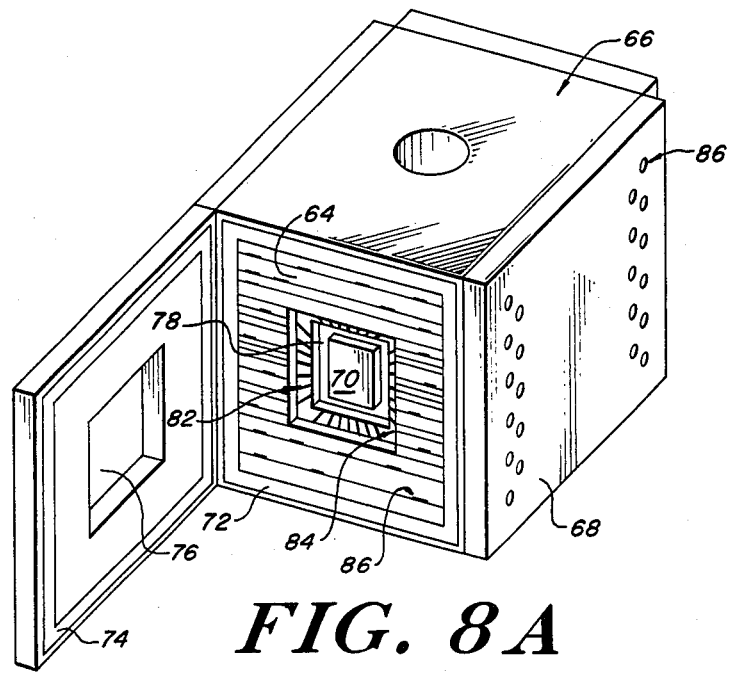
FIG. 8A is a perspective view of a high-density package in accordance with the present invention in which selected ones of the body faces are adapted to receive an integrated circuit die.
Figure 8B:
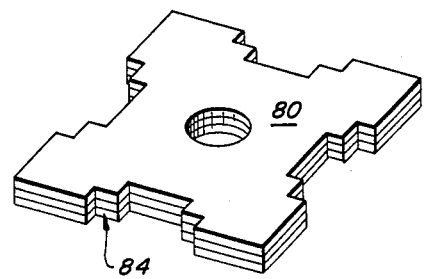
FIG. 8B shows selected ones of the layers of FIG. 8A.

In one embodiment of the invention illustrated in FIG. 8A one or more integrated circuit dies, typically of side dimension between 50 and 200 mils, are mounted directly to a face 64 of the body 66. A lid 68 of cross-section substantially equivalent to the face 64 is provided to encase integrated circuit die 70 between the lid 68 and the respective face 64 of the body 66. A seal ring 72 is provided on the periphery of each face 64 in accordance with any well-known metallization technique, and the face seal ring 72 mates with a corresponding lid seal ring 74 to hermetically seal the die 70 between the lid 68 and the face 64 upon mating of the lid 68 to the face 64. The die may be mounted on the face 64 of the body 66 and the lid 68 may be provided with a cavity 76 to accomodate the die 70. Alternatively a die receiving cavity 78 or cavities may be provided in respective faces 64 of the body by appropriately notching selected layers 80 of the body as illustrated in FIG. 8B. Connection sites 82 are disposed on the body face 64 or alternatively as shown in FIGS. 8A and 8B within a notched section 84 of the body face 64. Contact sites of the die 70 are electrically connected to ones of the connection sites 82 by wire bonding or any other suitable interconnection technique. Selected conductive paths 34 terminate in areas of connection sites 82 to provide electrical interconnection to the respective connection sites 82. The lid 68, may be fabricated of a cofired multilayer ceramic material, metal or other suitable material and is secured to the respective body face 64 after wire bonding or connecting by techniques known in the art, respective contact sites of the die 70 to appropriate connection sites 82.

Test points 86 may be provided by including conductive vias in the lid 68 in positions to mate with contact sites 86 disposed on the faces 64 of the body 66. Contact sites 86 are connected with respective connection sites 82 by conductive paths 34 disposed on and conductive vias 36 extending through selected layers 12 of the body 66.

Figure 9:
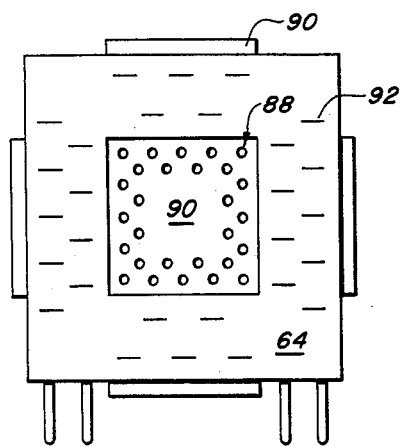
FIG. 9 illustrates a side elevation view of a package in accordance with the present invention adapted to receive integrated circuit dies on all faces and the top and bottom surface of the body.

Alternatively, test points 88 providing electrical access to die 70 contact sites on both the carrier 90 and the face 64 may be provided by employing a carrier 90 of the type shown in FIG. 9, of cross-section smaller than the respective face 64. Conductive vias in the carrier 90 terminating in test points 88 mate with an underlying first set of contact sites which are electrically interconnected to a second set of contact sites 92. The second set of contact sites 92 are peripheral to the carrier 90 after mating of respective carriers 90 with the body faces 64 and are therefore accessible for probing.

Figure 1:
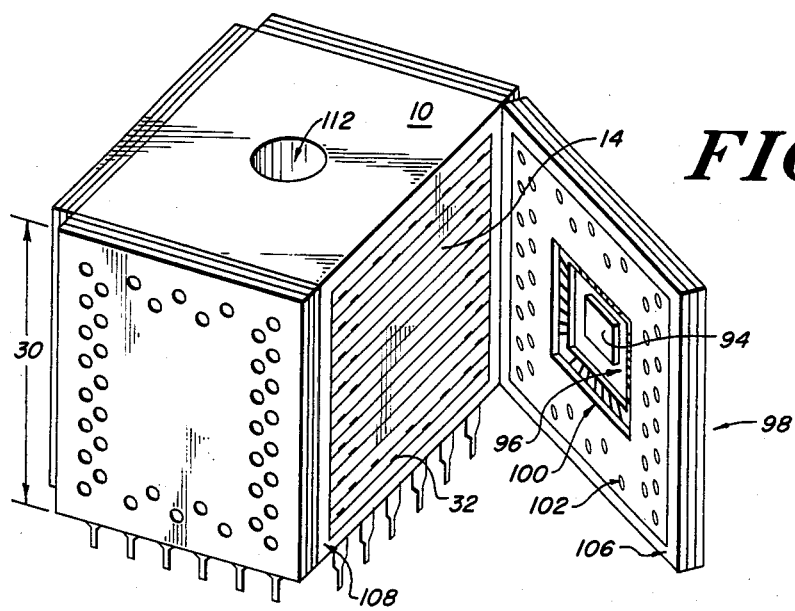
FIG. 1 is a perspective view of a high-density package in accordance with the present invention.

In the embodiment illustrated in FIG. 1 integrated circuit die 94 are secured within a cavity 96 of a chip carrier 98 fabricated of a plurality of ceramic layers laminated together to form the carrier 98. Carrier connection sites 100 are disposed within the carrier 98 cavity 96 peripheral to the integrated circuit die 94 permitting wire bonding of die contact sites to respective carrier connection sites 100. Carrier contact sites 102 are connected to respective carrier connection sites 100 by conductive paths and conductive vias disposed on and extending through respective layers of the carrier 98. Carrier contact sites 102 are disposed on the face confronting surface of the carrier 98 and are oriented to mate with corresponding face 14 contact sites 32.

Test point access is provided by conductive vias extending through layers of the carrier 98. The vias electrically connect to and/or from the carrier 98 contact sites 102. The carrier contact sites 102 provide test points which are beneficial for testing both before assembly of the carrier 98 to the face 14 and after final assembly of the carrier 98 and body 10.

Figure 10:
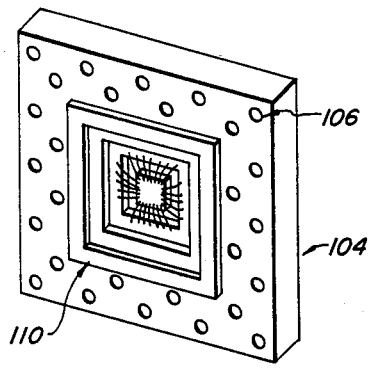
FIG. 10 is illustrative of a chip carrier in accordance with the present invention having test and/or connection sites on the normally exposed surface thereof.

Additionally, as illustrated in FIG. 10 a carrier 104 may be of smaller cross-section than the face 14 (FIG. 1) to which it is mated. By providing a first set of contact sites under a die receiving carrier 104, to mate with corresponding carrier contact sites 106 and a second set of contact sites on a respective body face 14, peripheral to the lid mating area, each second site connected to one of the first sites, a means for verification of the integrity of carrier 104 and face 14 contact site interconnections is provided.

One or more integrated circuit dies may be disposed within a given carrier, the size of the carrier and body being adjusted as desired for a specific circuit application.

A metallized seal ring 106 (FIG. 1) is typically disposed around the periphery of a die receiving carrier 98 to mate with a corresponding metallized seal ring 108 on the body face 14 thereby achieving hermetic encapsulation of integrated circuit die or dies between the carrier 98 and body face 14. As illustrated in FIG. 10 a seal ring 110 may be disposed interior to carrier 104 contact sites 106 permitting visual inspection of mating carrier and face contact sites after assembly of the carrier 104 to the respective face 14. Contact sites 106 may be raised to facilitate inspection of the sites and solder flux cleaning after mating of the carrier 104 to the respective body face 14.

Figure 11:
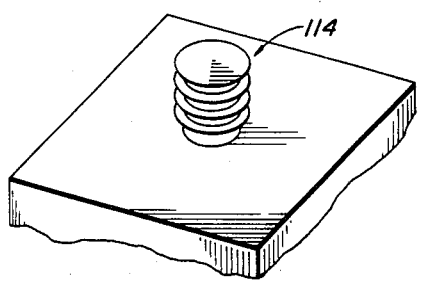
FIG. 11 is a perspective view illustrating a heat sink mounted to the high-density package in accordance with the present invention.

Any of the above-described embodiments may be provided with a bore 112 (FIG. 1) extending from the top surface of the body partially through to the bottom surface or entirely through the body 10. The bore 112 may be metallized and sized to receive a heat sink 114 to faciitate heat dissipation from the element as shown in FIG. 11. Alternatively, the element may be fluid cooled by passage of fluid through the bore 112 providing further improvement of heat dissipation characteristics.

A body, formed in accordance with the above disclosure may be adapted to receive, memory, microcomputer, gate array, buffer, peripheral or other integrated circuit devices on the respective faces of the body.

A purely illustrative example of the present package used to form a high density memory element follows.

A carrier 104 of multilayer ceramic material of the type shown in FIG. 10 is adapted to receive four 256 kilobit memory elements. Respective die contact sites of the four memory element dies are wire bonded to carrier connection sites provided peripheral to each respective memory element die and the die we electronically tested on the carrier 104. The connection sites are electrically connected to carrier contact sites peripherally disposed with respect to the carrier connection sites. Contact sites are disposed on respective planar faces of a multilayer ceramic unitary body to mate with corresponding carrier contact sites. Contact sites on respective faces are electrically interconnected in accordance with the present disclosure and selectively interconnected with input-output connections projecting from the bottom surface of the body. One carrier, containing four 256 Kilobit memory elements is electrically and hermetically mated to each of four faces of a substantially cubic body to form a four megabit memory element. A metallized bore extending through the body is provided with a heat sink to facilitate heat dissipation and improved operational reliability of the four megabit memory element. A thermally conductive elastomer may be employed to facilitate heat conduction from the body to the heat sink. Alternatively, the heat sink may be in thermal conducting relation with selected die carriers. To improve electrical noise immunity, chip capacitors may be mounted to selected faces of the body or alternatively, to contact sites within or on the carriers 104 specifically provided and oriented to receive the chip capacitors.

The above example and discussion are solely illustrative of specific embodiments for practicing the disclosed invention, the scope of the invention being limited only by the following claims.

What is claimed is:

1. A high-density package for receiving multiple integrated circuit devices thereon, comprising:
   a predetermined plurality of insulative layers laminated together in a direction of lamination to form a unitary three-dimensional body having at least four exterior faces, one of said faces being a mounting surface;
   said layers having peripheral edges which define, in the direction of lamination, at least some of said exterior faces, said plurality of layers forming at least some of said exterior faces being selected to provide a total dimension in the direction of lamination sufficient to support at least one integrated circuit device having a defined interconnection pattern;
   selected ones of said layers having conductive paths disposed thereon, at least some of said paths terminating at at least one of said exterior faces defining contact sites in an interconnection pattern corresponding to said interconnection pattern of said at least one circuit device;
   input-output means operatively associated with one of said exterior faces and electrically connected with selected ones of said conductive paths on at least some of said layers.

2. The package of claim 1 wherein said input-output means are input-output pins side brazed to selected faces of the body.

3. The package of claim 1 wherein said input-output means are input-output pins soldered to selected faces of the body.

4. The package of claim 1 wherein said input-output means are inputoutput pins brazed to the mounting surface of the body.

5. The package of claim 1 wherein said input-output means are input-output pins soldered to the mounting surface of the body.

6. The package of claim 1 wherein said input-output means comprise pins projecting from the mounting surface of the body and disposed in a pin grid arrangement.

7. The package of claim 1 wherein said input-output means comprise conductive pads disposed on the body mounting surface in a predetermined pad arrangement.

8. The package of claim 1 wherein said contact sites are formed at locations where selected conductive paths terminate in faces of the body.

9. The package of claim 1 wherein said contact sites are located to mate with contacts of leadless chip carriers.

10. The package of claim 1 wherein said contact sites are oriented to mate with leads of leaded chip carriers.

11. The package of claim 1 wherein each of said faces is adapted to receive one or more integrated circuit die and at least one integrated circuit die is affixed to at least one of said faces, said package further including a lid on each of the die receiving faces to encapsulate respective die between respective lids and faces.

12. The package of claim 9 wherein at least one face includes a metallized seal ring and each respective lid includes a corresponding seal ring to hermetically seal respective dies between respective lids and faces upon mating of the lids with the faces.

13. The package of claim 1 wherein said package includes a heat sink.

14. The package of claim 1 wherein said package is adapted for fluid cooling for improved thermal dissipation characteristics.

15. A high-density integrated circuit package comprising:
   a monolithic multifaceted ceramic body composed of a plurality of ceramic layers fused together to form said body, said body having at least four faces, one of said faces comprising a mounting surface;
   input-output means affixed to said body proximate to said body mounting surface;
   electrically conductive contact sites disposed on at least two of said faces of said body in a predetermined pattern;
   conductive paths disposed on and conductive vias extending through selected ones of said layers and electrically interconnecting selected contact sites with other selected contact sites and electrically interconnecting selected ones of said contact sites with selected ones of said input-output means;
   a plurality of chip carriers, each adapted to receive at least one integrated circuit die, said chip carriers having electrical contacts oriented on respective carriers in a pattern corresponding to contact sites on respective faces of said body, said electrical contacts on said chip carriers being electrically connected to corresponding contact sites on the respective faces of said body upon mating of said carriers with the respective faces of said body.

16. The package of claim 16 wherein at least one of said chip carriers is composed of a plurality of ceramic layers fused together to form a monolithic chip carrier.

17. The package of claim 16 wherein at least one of said chip carriers includes conductive paths disposed on and conductive vias extending through selected ones of said layers.

18. The package of claim 15 including conductive vias extending through said carriers, said vias connected to said carrier contacts, providing test point access to said contacts so as to permit testing of carriers prior to and after assembly of carriers to respective faces of said body.

19. The package of claim 15 wherein said input-output means are input-output pins side brazed to faces of the body.

20. The package of claim 15 wherein said input-output means are input-output pins brazed to the mounting surface of the body.

21. The package of claim 15 wherein said input-output means comprise pins projecting from the mounting surface of the body in a pin grid arrangement.

22. The package of claim 15 wherein said input-output means comprise conductive pads disposed on the mounting surface of the body in a predetermined pad arrangement.

23. The package of claim 15 wherein said contact sites are located where selected conductive paths terminate in faces of said body.

24. The package of claim 15 including an electronic circuit device wherein at least some of said carriers include a recess sized to receive said electronic circuit device and said electronic circuit device is mounted within said recess.

25. The package of claim 15 including,
a metallized seal ring around the periphery of at least one face of said body,
a metallized seal around the periphery of at least one of said carriers, said carrier seal oriented to mate with a corresponding metallized seal ring on the respective face of said body.

26. The package of claim 15 wherein said carriers include a face for mounting said carrier to said body and a non-mounting face opposing said carrier mounting face, said carriers having test points disposed on said non-mounting face, said test points being electrically connected to selected contact sites on said body via electrical connections extending through the carriers upon mating of said carriers to respective faces of said body.

27. The package of claim 26 wherein said carriers comprise a plurality of fused together ceramic layers and said electrical connections extending through the carrier comprise conductive paths disposed on selected ones of said ceramic layers of said carrier and conductive vias extending through selected ones of said ceramic layes of said carrier.

28. The pacakge of claim 15 wherein at least one chip carrier includes a metallized seal ring and at least one face of said body includes a seal ring corresponding in shape to said carrier metallized seal ring, said body seal ring and said carrier metallized seal ring forming a hermetic seal between the carrier and said body upon mating of the carriers to the respective faces of said body.

29. A high-density package for receiving multiple integrated circuit devices thereon, comprising:
a predetermined plurality of insulative layers laminated together in a direction of lamination to form a unitary three-dimensional body having at least four exterior faces, one of said faces being a mounting surface;
said layers having peripheral edges which define, in the direction of lamination, at least some of said exterior faces, said plurality of layers forming at least some of said exterior faces being selected to provide a total dimension in the direction of lamination sufficient to support at least one integrated circuit device having a defined interconnection pattern;
selected ones of said layers having conductive paths dispsed thereon, at least some of said paths terminating at at least one of said exterior faces defining contact sites in an interconnection pattern corresponding to said interconnection pattern of said at least one circuit device;
input-output means operatively associated with one of said exterior faces and electrically connected with selected ones of said conductive paths on at least some of said layers;
a plurality of chip carriers, each adapted to receive at least one integrated circuit die, said chip carriers having contacts oriented for interconnection with said face contact sites upon mating of said carriers with respective faces of said body.

30. A high-density integrated circuit package adapted to receive integrated circuit carrying devices comprising:
a monolithic multifaceted ceramic body composed of a plurality of ceramic layers fused together to form said body, said body having a plurality of faces, one of said faces being a mounting surface;
plural input-output means affixed to said body proximate to said body mounting surface;
contact sites disposed on at least two of said faces, at least some of said contact sites oriented in a predetermined pattern to mate with contacts of integrated circuit carrying devices;
conductive paths disposed on and conductive vias extending through selected ones of said layers, said paths and vias electrically interconnecting selected contact sites with other selected contact sites and electrically interconnecting ones of said contact sites with selected ones of said input-output connections;
each of said faces being adapted to receive at least one integrated circuit die and at least one integrated circuit die is affixed to at least one of said faces, said package further including a lid on each of the die receiving faces to encapsulate respective die between respective lids and faces;
said lids having a body confronting surface and an outer surface opposing said body confronting surface and having conductive test points on said outer surface;
said lids including conductive vias extending through the lids from the test points on said outer surface and terminating on said body confronting surface in locations selected to electrically connect with selected ones of said face contact sites, thereby providing electrical access to face contact sites after mating of the lids with respective faces.

* * * * *

UNITED STATES PATENT AND TRADEMARK OFFICE
CERTIFICATE OF CORRECTION

PATENT NO. : 4,727,410
DATED : Feb. 23, 1988
INVENTOR(S) : Leo M. Higgins III

It is certified that error appears in the above-identified patent and that said Letters Patent is hereby corrected as shown below:

Abstract, line 3, "chip carries" should read --chip carriers--

Column 2, lines 18-19 "ac-comodated" should read --ac-commodated--

Column 4, line 46, "accomodate" should read --accommodate--
line 53, "accomodate" should read --accommodate--

Column 5, line 37, "accomodate" should read --accommodate--

Column 8, line 2, "inputoutput" should read --input-output--
line 64, "16. The package of claim 16" should read --16. The package of claim 15--

Column 9, line 52, "layes" should read --layers--
line 53, "pacakge" should read --package--

Column 10, line 12, "dispsed" should read --disposed--

Signed and Sealed this

Second Day of May, 1989

*Attest:*

DONALD J. QUIGG

*Attesting Officer*     *Commissioner of Patents and Trademarks*